United States Patent
Koizumi et al.

(10) Patent No.: US 8,237,338 B2
(45) Date of Patent: Aug. 7, 2012

(54) CERAMIC, AND PIEZOELECTRIC/ELECTROSTRICTION ELEMENT

(75) Inventors: Takaaki Koizumi, Taijimi (JP); Takuya Katsuno, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 13/041,699

(22) Filed: Mar. 7, 2011

(65) Prior Publication Data

US 2011/0241479 A1   Oct. 6, 2011

(30) Foreign Application Priority Data

Mar. 30, 2010   (JP) .................. 2010-076899

(51) Int. Cl.
*H01L 41/187* (2006.01)
(52) U.S. Cl. ................. 310/358; 252/62.9 PZ
(58) Field of Classification Search ............ 310/358, 310/357, 359, 311, 363, 365, 339; 252/62.9 PZ, 252/62.9 R; 501/134; *H01L 41/187*
See application file for complete search history.

(56) References Cited

U.S. PATENT DOCUMENTS

| | | | | |
|---|---|---|---|---|
| 2005/0081456 A1* | 4/2005 | Ihara et al. | ............ | 51/307 |
| 2007/0228318 A1* | 10/2007 | Yuuya | ............ | 252/62.9 R |
| 2009/0185971 A1 | 7/2009 | Yokoyama et al. | | |
| 2010/0071179 A1 | 3/2010 | Koizumi et al. | | |
| 2011/0012049 A1 | 1/2011 | Koizumi et al. | | |
| 2011/0014362 A1 | 1/2011 | Koizumi et al. | | |
| 2011/0291530 A1* | 12/2011 | Koizumi et al. | ............ | 310/359 |

FOREIGN PATENT DOCUMENTS

| | | |
|---|---|---|
| EP | 0 826 643 A1 | 3/1998 |
| EP | 1 972 604 A1 | 9/2008 |
| JP | 10-139552 A1 | 5/1998 |

* cited by examiner

*Primary Examiner* — Thomas Dougherty
*Assistant Examiner* — Karen B Addison
(74) *Attorney, Agent, or Firm* — Burr & Brown

(57) ABSTRACT

A ceramic having a plurality of crystal grains that contain lithium and boron, the crystal grains are arranged in a planar direction, and the crystal grains have a mutually same crystal orientation with respect to the thickness direction, the ceramic having a portion defined by parallel sectional surfaces in a thickness direction, the portion being equally divided into a plurality of segments by parallel sectional surfaces in a planar direction, and when the amount of boron in each segment is compared, the thickness of a low boron concentration region, the low boron concentration region being a collection of segments displaying a boron amount of less than or equal to an average value for the maximum value and minimum value of the boron amount, is greater than or equal to 20% to less than or equal to 90% of the overall thickness of the portion.

4 Claims, 8 Drawing Sheets

CERAMIC, AND PIEZOELECTRIC/ELECTROSTRICTION ELEMENT

CROSS-REFERENCE TO RELATED APPLICATIONS

This application claims priority under 35 U.S.C. §119 to Japanese Patent Application No. 2010-076899 filed on Mar. 30, 2010. The entire disclosure of Japanese Patent Application No. 2010-076899 is hereby incorporated herein by reference.

BACKGROUND OF THE INVENTION

1. Technical Field

The technical field relates to a new ceramic and a piezoelectric or electrostriction element using the ceramic.

2. Description of the Related Art

Patent Literature 1 (Japanese Patent Application Laid-Open No. 10-139552) discloses a method in which a host material having a laminated perovskite structure with shape anisotropy and a guest material having an isotropic perovskite structure are prepared, the host material and the guest material are mixed, extruded and/or rolled, and then sintered. Patent Literature 1 discloses use of a crystal lattice in the host material as a template to enable epitaxial growth of crystals in the guest material.

SUMMARY OF THE INVENTION

In Patent Literature 1, the host material is a particulate material having a large ratio of major axis to minor axis (aspect ratio). However the composition of these types of materials is limited. In other words, in the method in Patent Literature 1, the narrow range of widths that can be selected for the material limits the types of compositions for the resulting ceramic. Furthermore, although it has been proposed to extend the selection range by using various additive materials, use of such additive materials may cause the composition of the resulting ceramic to not satisfy the desired requirements.

The present invention is proposed in light of the problems in the conventional techniques above, and has the object of providing a ceramic that can be manufactured using a new manufacture method and which realizes a high level of crystal orientation.

The ceramic according to a first aspect of the present invention is provided with a plurality of crystal grains that contain lithium and boron, are arranged in a planar direction (a first direction), have the mutually same crystal orientation with respect to the thickness direction (a second direction perpendicular to the first direction), and in which the ceramic that includes the following portion. The portion is a portion which is defined by parallel sectional surfaces in a thickness direction. The portion is equally divided into a plurality of segments by parallel sectional surfaces in a planar direction, and when the amount of boron in each segment is compared, the thickness of a low boron concentration region that is a collection of segments having a boron amount of less than or equal to an average value for the maximum value and the minimum value of the boron amount is greater than or equal to 20% to less than or equal to 90% of the overall thickness of that portion.

The low boron concentration region may be biased toward one of either end in the thickness direction of the portion.

Furthermore in at least a part of the ceramic, the number of crystal grains disposed with respect to the thickness direction may be one.

This ceramic may be used in a piezoelectric or electrostriction element including the ceramic and a pair of electrodes electrically connected with the ceramic.

BRIEF DESCRIPTION OF DRAWINGS

Referring now to the attached drawings, which form a part of this original disclosure:

FIG. 3A to FIG. 3C are figures showing a first aspect of a template layer preparation step in which FIG. 3A shows a grain layer formation process, FIG. 3B shows a fixing process, FIG. 3C shows a fixed grain body after the fixing process.

FIG. 4A to FIG. 4C are figures showing a second aspect of the template layer preparation step in which FIG. 4A shows the grain layer formation process and the fixing process, FIG. 4B shows a re-polymerizing process, and FIG. 4C shows the fixed grain body.

FIG. 5A to FIG. 5E are figures showing a third aspect of the template layer preparation step in which FIG. 5A shows an electrodeposition material formation process, FIG. 5B shows a drying process for the electrodeposition material 52, FIG. 5C shows a grain layer formation process, FIG. 5D shows a fixing process, and FIG. 5E shows a fixed grain body.

DETAILED DESCRIPTION OF THE INVENTION (1. Ceramic)

Figure 1:
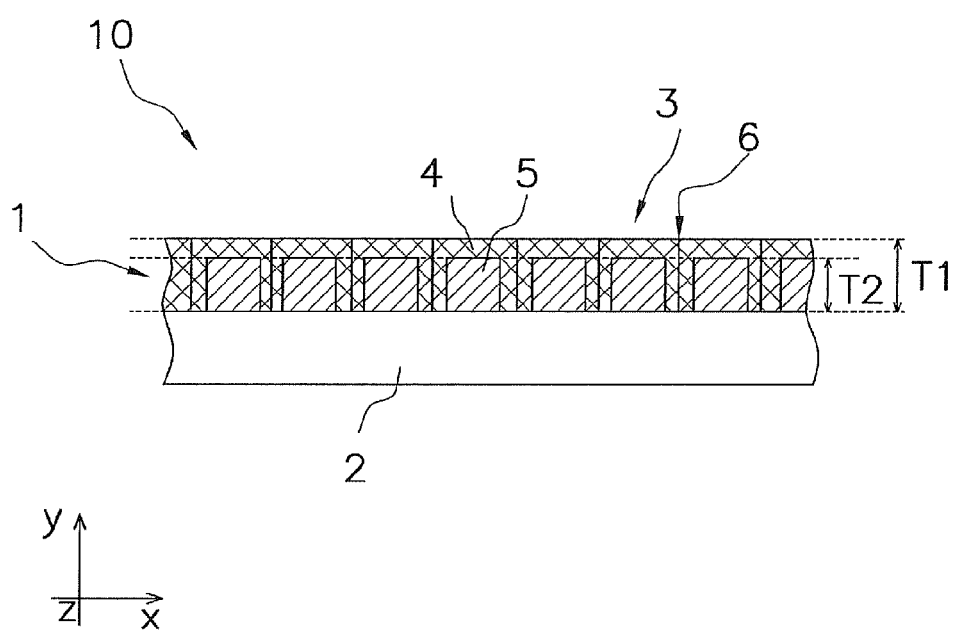
FIG. 1 is a sectional figure of a composite body of a base plate and a ceramic according to an aspect of an embodiment.

As shown in FIG. 1, the ceramic 1 according to an embodiment has a plurality of crystal grains 3 disposed adjacently with respect to a planar direction (z-x plane). In other words, the ceramic 1 is a polycrystalline body. In the present aspect, the crystal grains 3 are arranged on a base plate 2. That is to say, a composite body 10 is shown in FIG. 1. The composite body 10 includes the ceramic 1 and the base plate 2. The base plate 2 may be a material that is used in the manufacture of a crystallographically-oriented ceramic, such as platinum (Pt).

The crystal grains 3 shown in FIG. 1 have the same crystal orientation with respect to the thickness direction (y-axis direction). In other words, the ceramic 1 is a crystallographically-oriented ceramic. The "thickness direction" as used herein is a direction vertical to the planar direction. More specifically, a plurality of crystal grains 3 has the same crystal orientation with respect to an in-plane thickness.

However the ceramic 1 in a single composite body 10 may include crystal grains having a different crystal orientation. More specifically, the proportion of crystal grains 3 having the same crystal orientation in the ceramic 1 is preferably 80 volume % or more, and more preferably 90 volume % or more.

The ceramic 1 may be defined by the provision of a layer configured by crystal grains 3. In a single layer, a plurality of crystal grains 3 are arranged in a planar direction, and one crystal grain 3 is disposed in the thickness direction. In FIG. 1, since the number of crystal grains 3 in the thickness direction of the ceramic 1 is one, the ceramic 1 has a single layered structure. However two or more layers may be laminated in a thickness direction of the ceramic. In other words, two or more crystal grains 3 in the ceramic 1 may be superimposed in a thickness direction.

Although it is preferred that the number of crystal grains in the thickness direction in the overall ceramic 1, in other words in the overall composite body 10, is uniform, the number of crystal grains 3 in the thickness direction may vary at different positions within the ceramic 1. Although it is preferred that at least a portion of the ceramic 1 has a single layered structure in order to meet the requirements of thin film formation, it is further preferred that the entire ceramic 1 has a single layered structure.

The size of the crystal grains 3 contained in the ceramic 1 may be different.

The crystal grains 3 contain lead, lithium and boron.

The crystal grains 3 include a first portion 4 and a second portion 5. The first portion 4 and the second portion 5 have the same crystal orientation.

The first portion 4 includes lithium and boron. The constituent material used in the first portion 4 other than lithium and boron may be various known materials for composing piezoelectric bodies, electrostriction bodies, or crystallographically-oriented ceramics. More specifically, it is preferred that the first portion 4 includes lead (Pb). The first portion 4 may further includes titanium (Ti), zirconium (Zr), magnesium (Mg), niobium (Nb), nickel (Ni), sodium (Na), and/or barium (Ba). The first portion 4 may include as a principal component at least one substance selected from the group consisting of Pb(Zr, Ti)O3, Pb(Mg, Nb)(Zr, Ti)O3, Pb(Ni, Nb)(Zr, Ti)O3, Pb(Zn, Nb)(Zr, Ti)O3, Pb(Yb, Nb)(Zr, Ti)O3, (Pb, Sr)(Zr, Ti)O3, (Pb, Ba)(Zr, Ti)O3, (Pb, La)(Zr, Ti)O3, (Bi, Pb)(Ni, Nb)(Zr, Ti)O3, (Bi, Pb)(Mg, Nb)(Zr, Ti)O3, (Bi, Pb)(Zn, Nb)(Zr, Ti)O3, (Pb, Sr, La)(Mg, Ni, Nb)(Zr, Ti)O3, PbTiO3, Pb(Mg, Nb)TiO3, Pb(Ni, Nb)TiO3, and Pb(Zn, Nb)TiO3.

In the present specification, "includes as a principal component" means that a certain composition preferably comprises at least 70 wt. %, more preferably at least 80 wt. %, and still more preferably at least 90 wt. % of a specific substance.

The presence of boron was can be confirmed using an electron probe microanalyser (EPMA). The presence of lithium can be confirmed using a chemical assay, a secondary ionization mass spectrometer (SIMS) or glow discharge optical emission spectroscopy (GD-OES).

The boron concentration in the second portion 5 is lower than the boron concentration in the first portion 4. Furthermore the lithium concentration in the second portion 5 may be lower than the lithium concentration in the first portion 4. Although there is no particular limitation on other constituent elements, the second portion 5 preferably contains lead. An actual example of a material that contains lead may be a substance given as an example of a substance configuring the first portion 4. A combination of the substance configuring the first portion 4 and the substance contained in the second portion 5 may be suitably selected in response to the characteristics of the target ceramic.

In a single crystal grain 3, the second portion 5 may be connected in a planar direction and/or a thickness direction, or may be divided into two or more units. In other words, two or more second portions 5 may be disposed between two mutually adjacent crystal grain boundaries 6. The ceramic 1, in other words the composite body 10, may include a plurality of crystal grains 3 containing a different number of second portions 5. Furthermore the size of the second portions 5 may differ from the crystal grain 3 to the other crystal grain 3.

The ceramic 1 has the following portions as a result of the crystal grain 3 including the second portion 5. The portion is defined by parallel sectional surfaces parallel to the thickness direction. When an average value for the maximum value and minimum value of the boron amount is calculated by comparison of the boron concentration in different positions in a thickness direction in the portion, the length in a thickness direction of the region having a boron concentration less than or equal to the average value in the portion (hereafter referred to as the "low boron concentration region") is greater than or equal to 20% to less than or equal to 90% of the length in the thickness direction of the portion. More preferably, the average value is greater than or equal 20% to less than or equal to 80%, and still more preferably greater than or equal to 50% to less than or equal to 80%. At least one crystal grain 3 in a thickness direction is contained in this region. In other words, this region reaches from a first end of the crystal grain 3 in a thickness direction to a second end. The ceramic 1 may contain at least one such portion.

More specifically, the length in a thickness direction of the low boron concentration region is measured using the procedure (i) to (v) below.

(i) A portion defined by parallel (vertical to the planar direction) sectional surfaces in a thickness direction of the ceramic 1 is equally divided into a plurality ($\alpha$) of segments by parallel sectional surfaces in a planar direction.

(ii) The boron amount in each of the respective $\alpha$ segments is measured.

(iii) The boron concentration in the $\alpha$ segments is compared, and the maximum value and the minimum value is determined. In other words, the isovolumic boron amount (boron concentration) is compared with reference to the thickness direction.

(iv) The average value of the minimum value and the minimum value is calculated.

(v) When the number of segments having a boron amount that is less than or equal to the average amount in the $\alpha$ segments is greater than or equal to $0.2\alpha$ and less than or equal to $0.9\alpha$, the above conditions is determined to be satisfied. A segment having a boron concentration less than or equal to the average value is termed a low boron concentration region.

In FIG. 1, the overall thickness of the ceramic 1 is denoted as T1, and the thickness of the low boron concentration region is denoted as T2. Since the low boron concentration region in the ceramic 1 satisfies the above numerical range, $0.2T1 \leq T2 \leq 0.9T1$ is satisfied.

Still more specifically, the low boron concentration region is a portion determined by a signal intensity obtained by element mapping of boron with respect to the sectional surface of the ceramic 1. More specifically, (i) to (v) above may be restated as follows.

(i) Boron element mapping using EPMA is conducted with respect to the parallel (vertical to the planar direction) sectional surfaces in a thickness direction of the ceramic 1 to thereby obtain signals. The number of the signals is "X x Y". The number "X x Y" means a dot number in a thickness direction x a dot number in a planar direction.

(ii) An average signal intensity is calculated per dot for each respective Y lines formed from X dots in a planar direction. In this manner, Y average signal intensity is calculated.

(iii) The Y average signal intensities are compared in order to determine a maximum value and a minimum value.

(iv) The average value of the maximum value and the minimum value is calculated.

(v) Of the Y lines, the number of lines that have an average signal intensity that is less than or equal to the average value in (iv) above are specified. When the number of such specified lines is at least 0.2 Y and 0.9 Y or less, the above condition is taken to be satisfied.

The ceramic 1 that has been described with reference to FIG. 1 is merely an example of a ceramic in which the number of lines obtained in (v) above displays 20-90% of the Y lines in a thickness direction. In other words, FIG. 1 is merely schematic and the shape or the like of the portion that displays a relatively low boron concentration in the ceramic is not limited to the shape of the second portion 5 in FIG. 1.

The second portion 5 may be biased toward one of either end of the crystal grain 3 in the thickness direction. In other words, the low boron concentration region (the lines specified in (v) above) may be biased toward one of either end of the crystal grain 3. In the ceramic 1 shown in FIG. 1, the second portion 5 is disposed on the base plate 2, and therefore the low boron concentration region is biased towards the base plate 2. In this case, the 20% to 90% portion from one end with respect to the thickness of the crystal grain 3 may be the low boron concentration region.

Furthermore when the ceramic 1 is formed by a plurality of layers as described above, one layer may include both a low boron concentration region and a high boron concentration region (a region having a boron concentration of at least the average value in (iv) above). For example, when the second portion 5 displays a bias toward one end of the crystal grain 3 in a thickness direction, since a low boron concentration region displays a bias toward one end of one layer in the thickness direction, the thickness direction of the overall ceramic 1 expresses a low boron concentration region alternately with a high boron concentration region.

The ceramic described above displays a high amount of distortion when an electrical field is applied and displays excellent linear characteristics for distortion when a voltage is applied. In other words, the ceramic has excellent piezoelectric characteristics or electrostrictive characteristics. The reason by which such effects are obtained is thought to be that:

a structurally inclined region that tends to undergo deformation is present in the interface between the two regions (for example, the interface between the first portion 4 and the second portion 5) as a result of the presence of regions having different transcrystalline compositions such as the presence of the first portion 4 and the second portion 5 in the crystal grain 3; and the high level of correspondence in the crystal orientation.

These reasons suppress a reduction in distortion resulting from mutual interference caused by the crystal grain boundary in a non-180° domain rotation during application of an electrical field.

In the crystal grains of this type of ceramic, non-180° domain rotations occur in an avalanche form in response to the field intensity. Therefore the ceramic displays distortion behavior that has excellent linearity.

The structurally inclined region is a region as described hereafter. As described above, two regions having different composition such as the first portion 4 and the second portion 5 are present in a single crystal grain 3. Notwithstanding the different lattice constant in the first portion 4 and the second portion 5, these two portions are contained in a single crystal grain and the crystal orientation of the two portions is the same. Consequently it is predicted that a region that mitigates the difference in the lattice constant between the first portion 4 and the second portion 5, that is to say, a region having a lattice constant that is between lattice constant of the first portion 4 and the second portion 5, exists between these two portions. This type of region is a structurally inclined region. It is thought that a large distortion amount is caused when a voltage is applied to a ceramic having a structurally inclined region.

(2. Piezoelectric Element)

A piezoelectric element according to an embodiment will be described making reference to FIG. 2.

Figure 2:
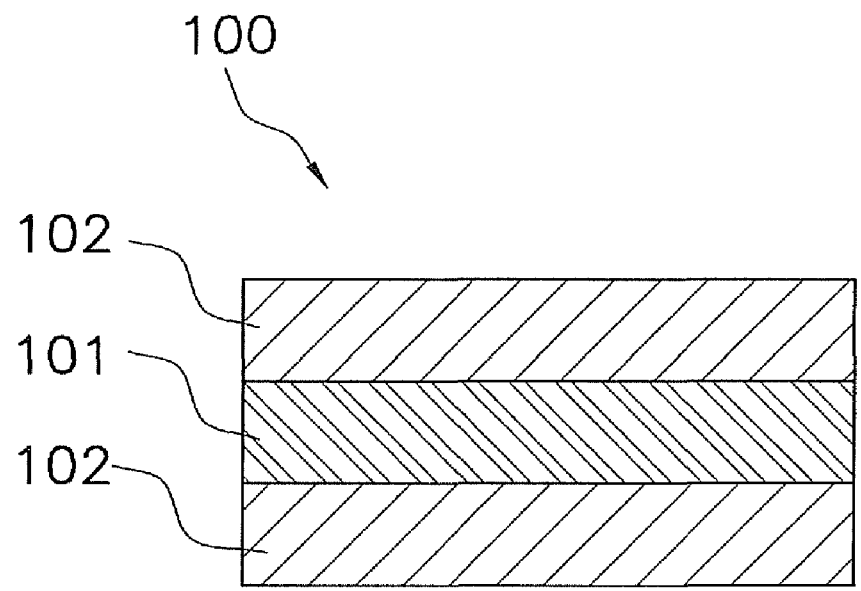
FIG. 2 is a sectional figure of a piezoelectric element according to an embodiment.
Figure 2:
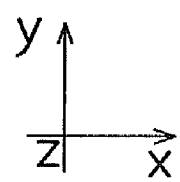

As shown in FIG. 2, a piezoelectric element 100 includes a piezoelectric body 101, and a pair of electrodes 102 provided on both sides of the piezoelectric element 100. The ceramic described above in FIG. 1 is suitable for use as the piezoelectric body 101. A distortion is produced in the piezoelectric body 101 by a voltage applied from a power source (not shown) between the two electrodes 102 by electrically connecting the two electrodes 102 with the piezoelectric body 101. The piezoelectric body 101 can convert a pressure applied to the piezoelectric body 101 into a voltage. The piezoelectric element 100 may also be used as an electrostriction element. The piezoelectric element 100 can be used as an electrostriction element, in other words, the ceramic above can be used as an electrostriction body.

The piezoelectric body 101 may be the composite body 10 above. Furthermore one of the two electrodes 102 and the piezoelectric body 101 may form the composite body 10. In this situation, the base plate 2 is the conductive body. In other words, the base plate 2 may function as the electrode 102 and the ceramic 1 as the piezoelectric body 101.

The piezoelectric element 100 for example can be used in an apparatus such as an inkjet head, a speaker, a pressure sensor, or the like.

(3. Method of Manufacturing Ceramic)

An aspect of a method of manufacturing the ceramic will be described referring to FIG. 3A to FIG. 5E. This method of manufacturing can be applied to the manufacture of the above ceramic. However there is no limitation on the method of manufacturing the above ceramic, and the object for manufacture by this method of manufacture is not limited to the above ceramic.

The method includes the following steps (1) to (3).

(1) A template layer preparation step for preparing a template layer in which the crystal orientation is arranged in a predetermined direction;

(2) A matrix formation step in which a matrix is formed by disposing a mixed material on the template layer, the mixed material being a mixture of a material including lead and an additive material including lithium and boron; and (3) A sintering step in which the matrix and the template layer are sintered at a predetermined sintering temperature.

Each step will be described below.

(1) Template Layer Preparation Step

This step prepares the template layer in which the crystal orientation is arranged in a predetermined direction. "The crystal orientation is arranged in a predetermined direction" includes a state in which all the crystal orientation (for example (100) plane or the like) is arranged in a predetermined direction, a state in which a certain proportion, for example 60% or more, 80% or more of the total, of the crystal orientation is arranged in a predetermined direction, or the like.

The template layer 19 includes a fixing compound that is fixed to a substrate 12 due to heat or a potential difference. The method of forming the template layer 19 includes the method shown in FIG. 3A to FIG. 3C, and the methods in FIG. 4A to FIG. 4C, and FIG. 5A to FIG. 5D.

(1-1) First Aspect of Template Preparation Layer Step

A first aspect of the template preparation layer step will be described making reference to FIG. 3A to FIG. 3C. In the present aspect, a template layer 19 is prepared by fixing template grains 14 configured from a material containing lead onto a substrate 12. More specifically, the method includes a grain layer formation process, a fixing process, and a washing process.

Figure 3A:
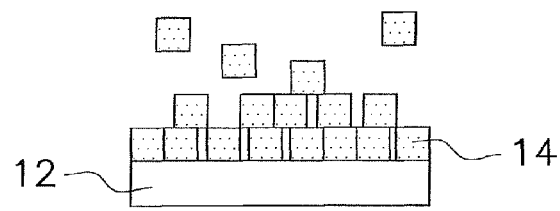

As shown in FIG. 3A, a layer configured by template grains 14 is formed on the substrate 12 in the grain layer formation process.

The template grains 14 may be disposed on the surface of the substrate 12. The substrate 12 for example includes at least one of glass, a monocrystal, a ceramic, a resin and a metal. The glass substrate includes for example quartz and non-alkali glass. The monocrystal substrate includes for example silicon, gallium arsenide, silicon carbonate, alumina, and strontium titanate. The ceramic substrate includes for example stabilized zirconium oxide, aluminum oxide, magnesium oxide, mullite, aluminum nitride, and silicon nitride. The resin substrate includes an epoxy resin or a polyester resin. The metal substrate includes stainless steel, aluminum, or platinum. An insulation resin may be coated on the metal. In the following description, a substrate 12 formed from platinum will be described.

The template grains 14 may be configured from a material containing lead. The template grains 14 for example may be prepared in advance to have a polyhedric shape. Preferably, the template grains 14 are cubic in shape. The cubic crystals of the material containing lead for example can be prepared by a hydrothermal synthesis method. For example, the material containing lead may use at least one substance selected from the group of substances given in (1) and (2) below.

(1) $Pb(Zr, Ti)O_3$, $Pb(Mg, Nb)(Zr, Ti)O_3$, $Pb(Ni, Nb)(Zr, Ti)O_3$, $Pb(Zn, Nb)(Zr, Ti)O_3$, $Pb(Yb, Nb)(Zr, Ti)O_3$, $(Pb, Sr)(Zr, Ti)O_3$, $(Pb, Ba)(Zr, Ti)O_3$, $(Pb, La)(Zr, Ti)O_3$, $(Bi, Pb)(Ni, Nb)(Zr, Ti)O_3$, $(Bi, Pb)(Mg, Nb)(Zr, Ti)O_3$, $(Bi, Pb)(Zn, Nb)(Zr, Ti)O_3$, $(Pb, Sr, La)(Mg, Ni, Nb)(Zr, Ti)O_3$, $PbTiO_3$, $Pb(Mg, Nb)TiO_3$, $Pb(Ni, Nb)TiO_3$, and $Pb(Zn, Nb)TiO_3$.

(2) A raw material formed from the above compositions after sintering (for example, the hydroxides, the oxides or the like of these substances).

Although there is no particular limitation on the size of the template grains 14 with reference to a specific value, the grains for example may have a size of 100 nm or more.

(Grain Layer Formation Process)

The grain layer formation process arranges the template grains on the substrate. There is no particular limitation on the specific details of the grain layer formation process as long as it is a method that supplies a formed grain layer to the subsequent fixing process. For example, as shown in FIG. 3A, the grain layer is formed without immersion of the substrate 12 in a solution. Furthermore in FIG. 3A, the grain layer is formed directly onto the substrate 12. This method of formation for example, may use one or more of a spray coating method, a spin-coat method, or a doctor blade method.

(Fixing Process)

Figure 3B:
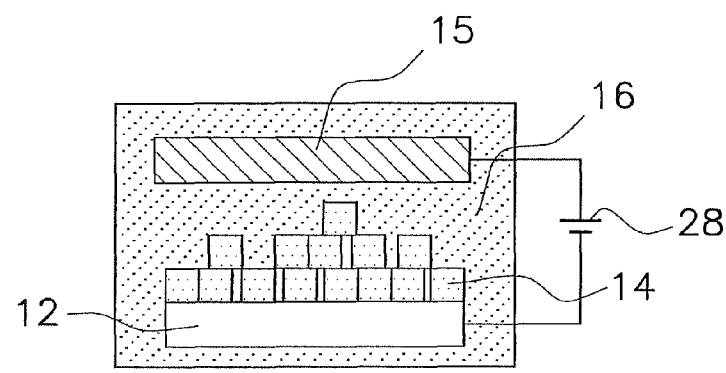

As shown in FIG. 3B, in the fixing process, the substrate 12 is immersed in a monomer solution 16 containing a chemical substance (monomer) that undergoes electropolymerization with a counter electrode 15 facing the substrate 12. The monomer undergoes electropolymerization on the substrate 12 due to the generation by the power source 28 of a potential difference between the substrate 12 and the counter electrode 15, and thereby forms a polymer. The polymer is shown as a resin 18 in FIG. 3C.

Figure 3C:
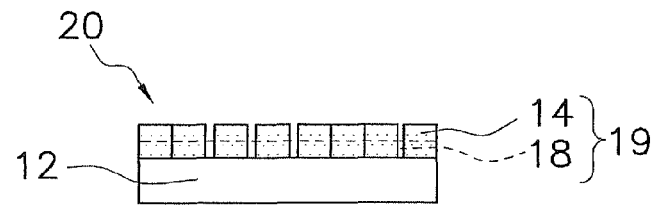

In this manner, as shown in FIG. 3C, the template layer 19 including the template grains 14 and the resin 18 is formed on the substrate 12. The resin 18 enters between the template grains 14 to thereby mechanically fix the template grains 14. Thus the template grains 14 are fixed more strongly to the substrate 12 than a method of simply arranging the template grains 14 on the substrate 12. In this manner, a fixed grain body 20 is obtained that includes a substrate 12 and a template layer 19.

The monomer solution 16 is a solution that contains one or more monomers that polymerize as a result of electropolymerization and are dissolved in a solvent and/or dispersed in a dispersion medium.

The monomer may be for example:
- a type of vinyl monomer such as styrene, N-vinylcarbazole, or the like;
- an aromatic compound such as aniline, phenol, or the like; and
- a heterocyclic compound such as pyrrole, thiofuran, furan, or the like.

The mechanism for electropolymerization depends on the type of monomer, but may include for example:
- a polymerization reaction mediated by radical cations or radical anions;
- a polymerization reaction caused by reactive species such reduced cations, anions and free radicals generated by oxidation or reduction of coexisting supporting electrolyte or added agents;
- chain polymerization; and
- step-growth polymerization.

The resin 18 after polymerization is the monomer polymer body described above. More specifically, the resin 18 includes polymer bodies of pyrrole-monomer such as pyrrole, alkylpyrrole, aminopyrrole, or the like, polymer bodies of aniline, or polymer bodies of thiofuran-monomer such as thiofuran, alkylthiofuran, thiofuran derivatives, or the like.

In particular use of a pyrrole aqueous solution is preferred from among the solutions of the above monomers due to ease of handling.

In order to induce electropolymerization, the monomer solution 16 may contain an oxidant such as an alkylbenzene sulfonate salt such as sodium p-toluenesulfonate, ethylbenzenesulfonic acid sodium, sodium dodecylbenzenesulfonate, or the like.

The electrical conditions including voltage and current and the processing time for the electropolymerization may be varied in response to the size of the template grains to be fixed, and the thickness and size of the target grain layer.

(Cleaning Process)

Excess template grains 14 on the substrate 12, that is to say, template grains 14 that are not fixed by the resin 18 produced by electropolymerization are removed by a cleaning process. The cleaning process is performed by running water washing, ultrasonic cleaning, or the like.

(1-2) Second Aspect of the Template Layer Preparation Step

Description which overlaps with the first aspect will not be repeated in the following description. In other words, materials and processing that are not described below adopt a configuration that is the same as the first aspect.

(Grain Layer Formation Process and Fixing Process)

The grain layer may be formed by immersing the substrate 12 in a solution (slurry) containing the template grains 14. This type of method for example may include one, or a combination of two or more of the following methods:

a method of sedimentation of the template grains 14 in the slurry by immersing and holding stationary the substrate 12 in the slurry that contains a dispersal of the template grains 14;

an LB method in which the template grains 14 are arranged in a liquid phase interface, and the substrate that is immersed in a lower phase is raised;

a method of electrophoresis; and a dipping method.

The slurry may include the above mentioned monomer that undergoes electric field polymerization.

When forming the grain layer, the grains may be disposed more densely on the substrate 12 by application of mechanical vibration, sound waves, heat, light or magnetic fields.

Since the grain layer is immersed in a solution in the fixing process, a drying process and/or heating process may be performed after formation of the grain layer to thereby impart strength to the grain layer.

Figure 4A:
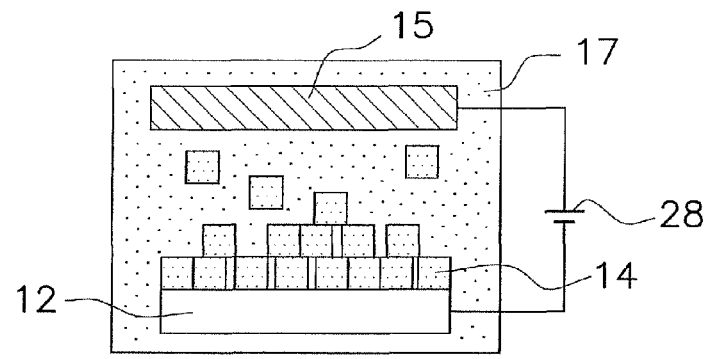

FIG. 4A shows a method of sedimentation of the template grains 14 by immersion of the substrate 12 in the slurry. This method can be performed at the same time as the fixing process (electropolymerization of the fixing compound monomer), and even when performed after the fixing process, there is the advantage that transition of processing can be executed smoothly.

As shown in FIG. 4A, the substrate 12 is immersed in a slurry 17 including the template grains 14 and the monomer that undergoes electropolymerization contained in a reaction vessel. In the reaction vessel, a counter electrode 15 is disposed facing the substrate 12.

After forming the grain layer on the substrate 12, the monomer undergoes electropolymerization as a result of continued immersion of the substrate 12 in the slurry 17. Consequently the template grains 14 are fixed to the substrate 12 by the polymerized resin 18. As a result, a template layer 19 is formed.

The grain layer can also be formed on the substrate 12 by immersing and raising the substrate 12 in the slurry 17 in which the template grains 14 float in a membranous form on the surface of the liquid and the counter electrode 15 is opposed to the substrate 12 as shown in FIG. 4A. In this case, when the substrate 12 is raised, the monomer may undergo electropolymerization by creation of a potential difference between the substrate 12 and the counter electrode 15, and fix the grain layer with the polymerized resin 18. According to this process, the formation of the grain layer and the fixing of the template grains 14 can be executed at substantially the same time. As a result, a relatively thin grain layer is obtained.

(Re-Polymerization Process)

The template layer preparation step may include a re-polymerization process.

Figure 4B:
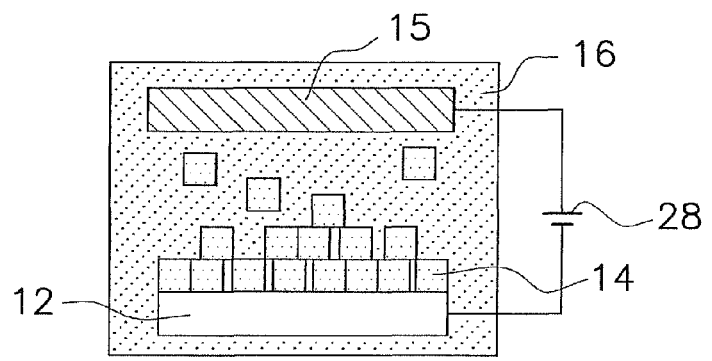

As shown in FIG. 4B, in the re-polymerization process, after passing through the grain layer formation process and the fixing process, the substrate 12 is immersed in the monomer solution 16 described above that contains monomers and does not contain template grains 14. The monomer can be subjected to electropolymerization on a subsequent occasion by providing a potential difference between substrate 12 and the counter electrode 15.

Figure 4C:
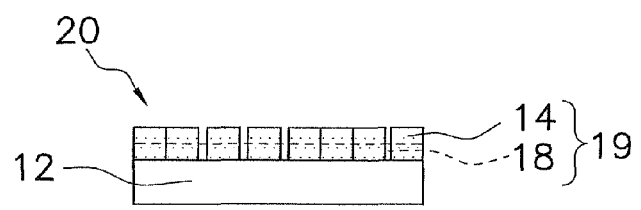

After passing through this process, the template layer 19 includes a further polymer body. As a result, elimination of template grains 14 from the uppermost layer is facilitated, and in other words, a template layer 19 is obtained in which the number of template grains 14 with respect to the thickness direction is one (FIG. 4C).

For example, in the fixing process (FIG. 4A), when template grains from a sub-micron size to several microns are fixed by a conductive polymer, a single layer of template grains 14 can be easily obtained by execution of a re-polymerization process (FIG. 4B) using a conductive monomer solution as the monomer solution 16.

The cleaning process above may be performed after the re-polymerization process, or may be performed before and after the re-polymerization process.

(1-3) Third Aspect of the Template Layer Preparation Step

Description which overlaps with the first aspect or the second aspect will not be repeated in the following description. In other words, materials and processing that are not described below adopts a configuration that is the same as the first aspect or the second aspect.

According to the methods shown in FIG. 5A to FIG. 5E, a fixed grain body 60 including a substrate 12 and template grains 14 fixed to the substrate 12 can be prepared by using a thermoplastic electrodeposition material as a fixing compound in the fixing process in substitution for a chemical substance that undergoes electropolymerization. This method includes an electrodeposition material layer formation process, a fixing process, and a cleaning process.

(Electrodeposition Material Layer Formation Process)

Figure 5A:
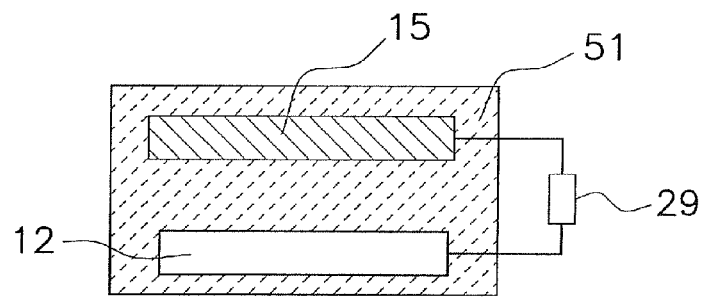
Figure 5B:
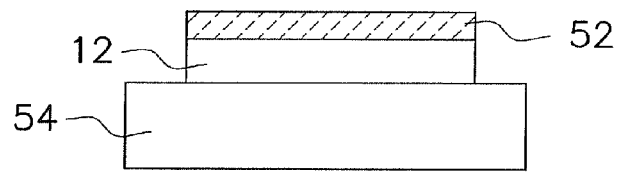

As shown in FIG. 5B, the electrodeposition material layer formation process forms an electrodeposition material layer 52 that is configured as a layer of a thermoplastic electrodeposition material on the substrate 12. In the electrodeposition material layer formation process, the substrate 12 is immersed in a thermoplastic electrodeposition material solution 51 that contains the thermoplastic electrodeposition material in a situation where the counter electrode 15 faces the substrate 12, as shown in FIG. 5A. The electrodeposition material layer 52 that is configured as a layer of a thermoplastic electrodeposition material is formed by producing a potential difference between the substrate 12 and the counter electrode 15 with the power source 29 (FIG. 5B).

The thermoplastic electrodeposition material may include for example:

a carbon-based polymer compound such as an epoxy resin, a polyimide resin, a polyamide-imide resin, and acrylic resin, or the like;

a silicon-based polymer compound such as a silicon resin, or the like; and an oxide nanograin of alumina for example that has a dispersant adhered to a surface thereof and that has an electrostatic charge.

Furthermore the thermoplastic electrodeposition material may be in a cationic form in which the covering film component is positively charged or may be in an anionic form in which the covering film material is negatively charged. The potential on the substrate 12 is determined by whether the thermoplastic electrodeposition material is in a cationic form or in an anionic form.

The solvent or the dispersion medium for the thermoplastic electrodeposition material solution 51 for example includes an inorganic solvent such as water, or the like, or an organic solvent such as alcohol, or the like. More specifically, the thermoplastic electrodeposition material solution 51 may be a water-based electrodeposition coating material. The water-based electrodeposition coating material is preferably used due to simplicity of handling.

The thermoplastic electrodeposition material solution 51 may include a catalyst such as a tin compound or a hardening agent such as a blocking isocyanate, or the like.

As shown in FIG. 5B, the electrodeposition material layer 52 may be dried using a heater 54, or the like.

(Grain Layer Formation Process)

Figure 5C:
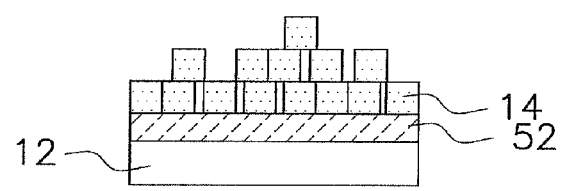

As shown in FIG. 5C, the grain layer formation process disposes the template grains 14 on the electrodeposition material layer 52. Since the method of disposition of the template grains 14 has already been described, detailed description will not be repeated.

(Fixing Process)

Figure 5D:
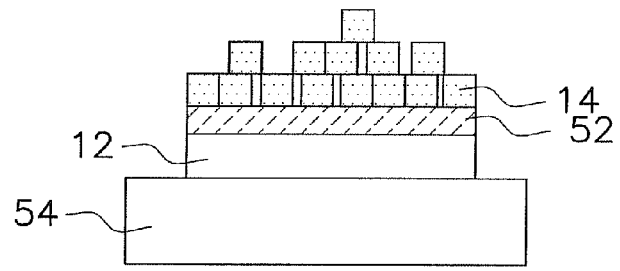
Figure 5E:
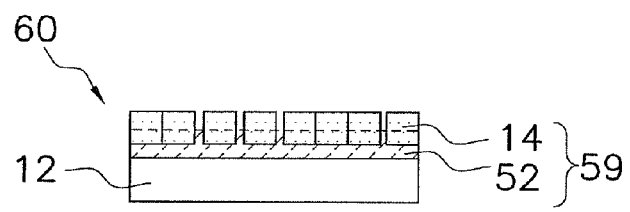

Next, the template grains 14 are fixed by the electrodeposition material layer 52 onto the substrate 12 by heating the electrodeposition material layer 52 to thereby form the template layer 59. In FIG. 5D, the thermoplastic electrodeposition material in the electrodeposition material layer 52 is heated to a melting temperature by the heater 54. In FIG. 5D, the heater 54 is disposed so that the substrate 12 is interposed between the heater 54 and the electrodeposition material layer 52.

The fixing process may be executed by inserting the substrate 12 into an oven or the like and heating, or by irradiating electromagnetic waves onto the electrodeposition material layer 52.

The thermoplastic electrodeposition material enters between the template grains 14 as a result of the heating of the thermoplastic electrodeposition material, and thus mechanically fixes the template grains 14 in the template layer 59 onto the substrate 12 as a result of the thermoplastic electrodeposition material entering between the template grains 14.

Needless to say, the cleaning process may also be executed in this aspect.

(1-4) Combination

As described above, the template layer preparation step according to the first to the third aspects includes a plurality of processes. The items described as processes or as elements of the different aspects may be mutually combined.

(2) Matrix Formation Step

Figure 3D:
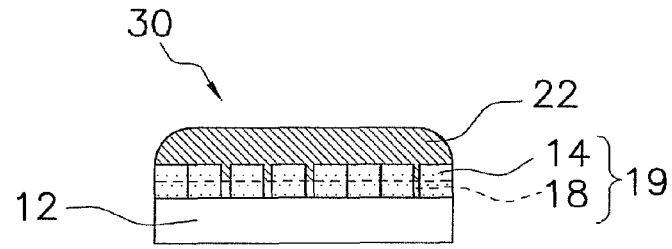
FIG. 3D shows a shaped body after a matrix formation process.

The matrix formation step disposes a matrix material on the template layer. In this manner, for example, in the fixed grain body 20 as shown in FIG. 3C, a matrix 22 is formed on the template layer 19 as shown in FIG. 3D. A shaped body 30 is prepared in this manner. All of the template layer preparation steps described above can be respectively combined with the matrix formation step or any subsequent step.

The matrix material may be a mixture of an additive material including lithium or boron and a material containing lead.

There is no particular limitation on the additive material to a specific composition and it may be any material that adds lithium and boron to the matrix. The additive material that contains lithium and boron for example includes at least one compound selected from the group consisting of $LiBO_2$, $Li B_4 O_7$, $LiB(OH)_4$, $Li_3BO_3$, $Li_6B_4O_9$, $LiB_3O_5$, and $Li_2B_8O_{13}$. Furthermore lithium may be contained in at least one additive material of $Li_2CO_3$ and LiF.

The added amount of the additive material is preferably in the range of at least 0.05 wt. % to 10 wt. % or less of the overall matrix. When the added amount is 0.05 wt. % or more, a larger orientation effect is obtained. When the added amount is 10 wt. % or less, an effect is obtained that the residual amount after sintering is not excessive.

The material containing lead may be a material described in relation to the material for the template grain. The material containing lead may be suitably selected in response to the composition or the like of the template grains 14 described above, or the target composition.

The method of provision of the matrix material for example may include one, or a combination of two or more of the following methods:

a method of coating by spraying;
a method of spin-coating;
a doctor-blade method; and
a dipping method.

(3) Sintering Step

The sintering step sinters the resulting shaped body at a predetermined sintering temperature, removes the resin 18 and forms the template layer 19 and the matrix 22 into a piezoelectric body. In other words, this step forms a crystallographically-oriented ceramic.

The sintering temperature is set in response to the composition of the target ceramic. The sintering temperature is set for example at 1100° C. or less, and preferably to 1000° C. or less. The sintering temperature is preferably set to 900° C. or more. The temperature required for orientation of the crystals is suppressed to a lower temperature by the additive material including lithium and boron.

The sintering atmosphere is not limited to a particular gas and may be an atmosphere of atmospheric air.

During the sintering step, the action of the additive material causes crystal growth in the matrix 22 in a crystal orientation that is arranged in a predetermined direction of the template layer 19. Thus a ceramic can be manufactured with superior orientation in which the crystal orientation is arranged in a predetermined direction by sintering of the substrate 12 which forms the template layer 19 and the matrix 22 on a surface thereof. The reason that such an effect is obtained is conjectured to be due to the action of the additive material that includes lithium and boron in facilitating the growth of the material containing lead into a polyhedral shape.

Since lithium and boron are vaporized by sintering, the lithium and boron content amount (concentration) in the sintered body may be lower than the shaped body before sintering.

The matrix 22 can form the first portion 4 in the ceramic 1 shown in FIG. 1. The second portion 5 may originate in the template grains 14. However there is not a limitation such that a single second portion 5 corresponds to a single template grain 14. In other words, a single second portion 5 may be produced from two or more template grains 14. In the matrix 22, the portion that has a reduced boron concentration as a result of vaporization of boron may be included in the second portion 5.

The base plate 2 configured in FIG. 1 may be the substrate 12.

According to the method described above, since the matrix 22 is formed on the template grains 14, the portion that displays a low boron concentration in the ceramic after sintering has a tendency to be biased towards one of the portions originating in the matrix 22 towards the thickness direction. In other words, the low boron concentration region and the second portion 5 have a tendency to be disposed towards the base plate 2 in the ceramic 1.

(4) Post-Annealing Step

The method of manufacturing the ceramic may include a post-annealing step. The post-annealing step heats the sintered body (ceramic) obtained after the sintering step. In this step, the amount of the additive material contained in the ceramic is reduced.

The post-annealing step for example may be executed under the same conditions of temperature, retaining time and atmospheric conditions as the conditions for the sintering step. Furthermore the post-annealing step for example may include one or a combination of the following methods:

long-term retention at a temperature lower than the conditions for the sintering step, for example a temperature of at least 700° C. and 1000° C. or less; or heating in an atmosphere in which the partial pressure of oxygen adjusted to a pressure in which the additive material tends to vaporize.

(5) Other Aspects

The present invention is not limited to the aspects described above, and various modifications may be added within a scope that does not depart from the spirit of the present invention. For example, the above aspects may be modified in the following manner.

(5-1)

In the above aspects, an electrically conductive material was used as the substrate 12. Thus the substrate 12 can be used as an electrode in the fixing process. For that reason, the template grains 14 can be directly disposed on the substrate 12. Furthermore the substrate 12 can be used as a driving electrode for the piezoelectric body.

A substrate 12 having surfaces with insulation characteristics may be used, an electrically conductive electrode may be disposed on the substrate 12, and the template grain 14 may be disposed on the electrode. In this manner, the electrode that is used for fixing the template grains 14 can be used as a driving electrode for the piezoelectric body without further modification. The material used in the electrode for example may be at least one type selected from the group consisting of:

platinum, palladium, ruthenium, gold, and silver;
alloys thereof; and
conductive polymers.

Furthermore the pattern method for the electrodes for example may be any of vapor deposition, sputtering, screen printing, electroless plating, or interfacial polymerization of monomers. A region on the electrode not provided with template grains 14 may be masked.

(5-2)

A step in which template grains 14 are oriented on the substrate 12 in order to prepare template layer in which the crystal orientation is arranged in a predetermined direction has already been described as a template layer preparation step.

In addition, the template layer preparation step may prepare a substrate in which the crystal orientation is arranged in a predetermined direction. When using this substrate, there is no need to provide template grains on the substrate. In other words, the substrate itself functions as the template.

A monocrystal substrate in which the crystal orientation is arranged in a predetermined direction may be used as the substrate in which the crystal orientation is arranged in a predetermined direction. The monocrystal substrate may be for example, silicon, gallium arsenide, silicon carbonate, alumina, and strontium titanate, magnesium oxide, calcium fluoride, lithium niobate, lithium tantalate, potassium tantalate, cerium oxide, and the like.

A deposition film of platinum, titanium, strontium ruthenate, lanthanum nickelate, yttria stabilized zirconia, cerium oxide, and the like may be formed on the monocrystal substrate as a lower electrode or as a buffer layer that mitigates the lattice constant difference.

In this manner, when the substrate itself acts as a template, the matrix 22 may be directly formed on the surface of the substrate 12 in the matrix formation step.

Furthermore at least one of the template layer and the matrix may be pre-formed as a sheet. For example, a template sheet may be prepared by aligning the template grains 14 in which the crystal orientation is arranged in a predetermined direction, and forming into a sheet shape. A matrix sheet may be prepared by forming a mixed material that is a mixture of a material including lead and an additive material including lithium and boron into a sheet shape. A crystallographically-oriented ceramic may be manufactured by preparing a laminated body in which the template sheet and the matrix sheet are laminated alternately, and sintering the laminated body.

After preparing ceramic sheets by sintering the template layer and the matrix together, a matrix laminated body may be manufactured by adhering these ceramic sheets together.

The method of manufacture described above was a RGTT method (reactive template grain growth method). However as described above, there is no limitation on the method of manufacturing the ceramic.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

EXAMPLES

Examples of the present invention will be described in detail below. However these examples do not limit the invention.

Example 1

1. Preparation of Samples
1-1 Template Layer Preparation Step
i) Preparation of Template Grains A platinum base plate with a thickness of 0.5 mm and a size of 10 mm×10 mm was used as a substrate.

The raw material for the template layer uses a lead aqueous solution including lead acetate trihydrate (Kanto Kagaku Co., Inc.), ethylenediaminetetraacetic acid (Kanto Kagaku Co., Inc.), and potassium hydroxide (Kanto Kagaku Co., Inc.); an aqueous solution of zirconium containing zirconyl chloride octahydrate (Kanto Kagaku Co., Inc.); an aqueous solution of titanium chloride (Wako Pure Chemical Industries, Ltd.); and an aqueous solution of potassium hydroxide containing potassium hydroxide (Kanto Kagaku Co., Inc.). These raw materials were mixed in a molar ratio (ratio of numbers of atoms) of Pb:Zr:Ti=1.1:0.7:0.3 to prepare a raw material solution.

30 ml of the raw material solution was placed into a 100 ml SUS pressure vessel having inner walls of polytetrafluoroethylene, and subjected to hydrothermal synthesis for 4 hours at 165° C. to obtain lead zirconate titanate (hereafter PZT) grains having a cubic shape and a grain diameter of 2 μm. The grain diameter of the PZT grains is a median diameter (D50) measured using water as a dispersion medium with a dynamic scattering grain size distribution measuring apparatus Zetasizer Nano nano-ZS manufactured by Spectris Co., Ltd.

The PZT grains were used as template grains in the following operation.

ii) Formation of Template Layer

Dodecylbenzenesulfonic acid sodium (Kanto Kagaku Co., Inc.) and pyrrole (Kanto Kagaku Co., Inc.) were added to 30 ml of pure water to have a concentration of 0.01 mol/L (liter) and thereby prepare a pyrrole aqueous solution. The pyrrole aqueous solution was placed in a beaker and 1 wt. % of the PZT grains was introduced into the pyrrole aqueous solution.

Then a dispersing process was executed with a homogenizer to thereby prepare a turbid liquid (slurry).

Then the above base plate was placed on the bottom of the beaker holding the slurry, and held in a stationary position for 10 minutes until the PZT grains sediment and build up thereon.

Next, a SUS counter electrode was disposed with a 1-mm electrode interval to be parallel to the base plate and connected to a power source so that the base plate is the negative pole and the counter electrode is the positive pole. A polypyrrole was formed on the base plate by applying a 2 Hz triangular wave at a peak voltage of 5V on 30 occasions between the base plate and the counter electrode.

Excess PZT grains were removed by rocking the base plate having the polypyrrole deposition film in the aqueous solution. Thereafter ultrasonic cleaning in pure water was executed to thereby remove PZT grains attached to portions other than the base plate. The ultrasonic cleaning was performed under conditions of 40 kHz and 1 minute using an ultrasonic cleaning apparatus (UT-106, Sharp Corporation).

The operation above obtained a base plate in which the planar orientation of the PZT grains was fixed in a membranous orientation on a platinum base plate arranged in a (100) direction.

1-2 Matrix Formation Step, Sintering Step

The raw material for the matrix (hereafter termed the "piezoelectric body material") was lead oxide (Mitsui Mining and Smelting Co., Ltd.), titanium oxide (Ishihara Sangyo Kaisha, Ltd.), zirconium oxide (Nippon Denko Co., Ltd.), niobium oxide (Mitsui Mining and Smelting Co., Ltd.), magnesium carbonate (Konoshima Chemical Co., Ltd.), nickel oxide (Seido Chemical Industry Co., Ltd.), and nickel oxide (Seido Chemical Industry Co., Ltd.). These raw materials were used in a known solid phase reaction method to prepare a composition of lead magnesium nickel niobate (Pb(Mg, Ni, Nb)$O_3$) and lead zirconate titanate (Pb(Zr, Ti)$O_3$) having a composition ratio of 2:8 (hereafter termed "20PMNN-80PZT").

An additive material such as 3 wt. % of lithium fluoride (LiF), or 1 wt. % of lithium borate ($Li_2B_4O_7$) was added to 20PMNN-80PZT. The concentration of lithium fluoride and lithium borate is a weight percent related to the overall matrix, that is to say, relative to the total of 20PMNNBNN-80PZT and the additive material. Using acetone as a solvent, 20PMNNBNN-80PZT and the additive material were mixed for 24 hours in a polyethylene vessel.

A powder was obtained by drying the mixed solution. A butyral binder (Sekisui Chemical Co., Ltd. BL-S), a dispersing agent (Kao Corporation SPO-30), a plasticizer (Kurogane Kasei Co., Ltd. DOP), and a dispersant (Katayama Chemical Ltd. terpineol) were added to the powder, to thereby obtain a PZT paste by kneading with a tri-roll mill.

The PZT paste was coated uniformly by spin-coating on the base plate with PZT grains arranged thereon. The rotation speed for spin-coating was 1000 rpm and the coating period was 30 seconds. The base plate after coating was placed onto a hotplate and dried at 90° C. for 5 minutes to thereby obtain a shaped body (FIG. 3(d)). This shaped body was subjected to degreasing for 2 hours at 500° C.

The rate of temperature increase was 200° C./h, and the shaped body after degreasing was sintered at 1000° C. for three hours. The atmosphere used during sintering was atmospheric air and after completion of sintering the rate of temperature decrease was 200° C./h.

A ceramic sample was obtained by the above operation.

2. Orientation

An X-ray diffraction (XRD) pattern of the ceramic resulting from irradiation of the ceramic crystal plane with X-rays was measured using an XRD apparatus (X-ray diffraction apparatus X'Pert MPD Pro, Spectris Co., Ltd.).

Using the measurement results, the degree of orientation of a pseudocubic (100) plane was measured by a Lotgering method from Formula (1) below using the peaks of the pseudocubic (100), (110) and (111) planes. The orientation resulting from the Lotgering method is obtained from Formula (1) below by measuring the XRD pattern with respect to an oriented face of the crystallographically-oriented ceramic. In Formula (1), $\Sigma I(hkl)$ is the sum of the X-ray diffraction intensities of all crystal planes (hkl) measured in the crystallographically-oriented ceramic. $\Sigma I_o(hkl)$ is the sum of the X-ray diffraction intensities of all crystal planes (hkl) measured in non-oriented substances that have the same composition as the crystallographically-oriented ceramic. $\Sigma'I(HKL)$ is the sum of the X-ray diffraction intensities of crystallographically equivalent specified crystal planes (for example, (100) plane) measured in the crystallographically-oriented ceramic. $\Sigma'I_o(HKL)$ is the sum of the X-ray diffraction intensities of specified crystal planes measured in non-oriented substances that have the same composition as the crystallographically-oriented ceramic.

[Formula 1]

$$\text{Degree of orientation} = \frac{\frac{\sum' I(HKL)}{\sum I(hkl)} - \frac{\sum' I_0(HKL)}{\sum I_0(hkl)}}{1 - \frac{\sum' I_0(HKL)}{\sum I_0(hkl)}} \times 100\% \quad (1)$$

3. EPMA

Figure 6:
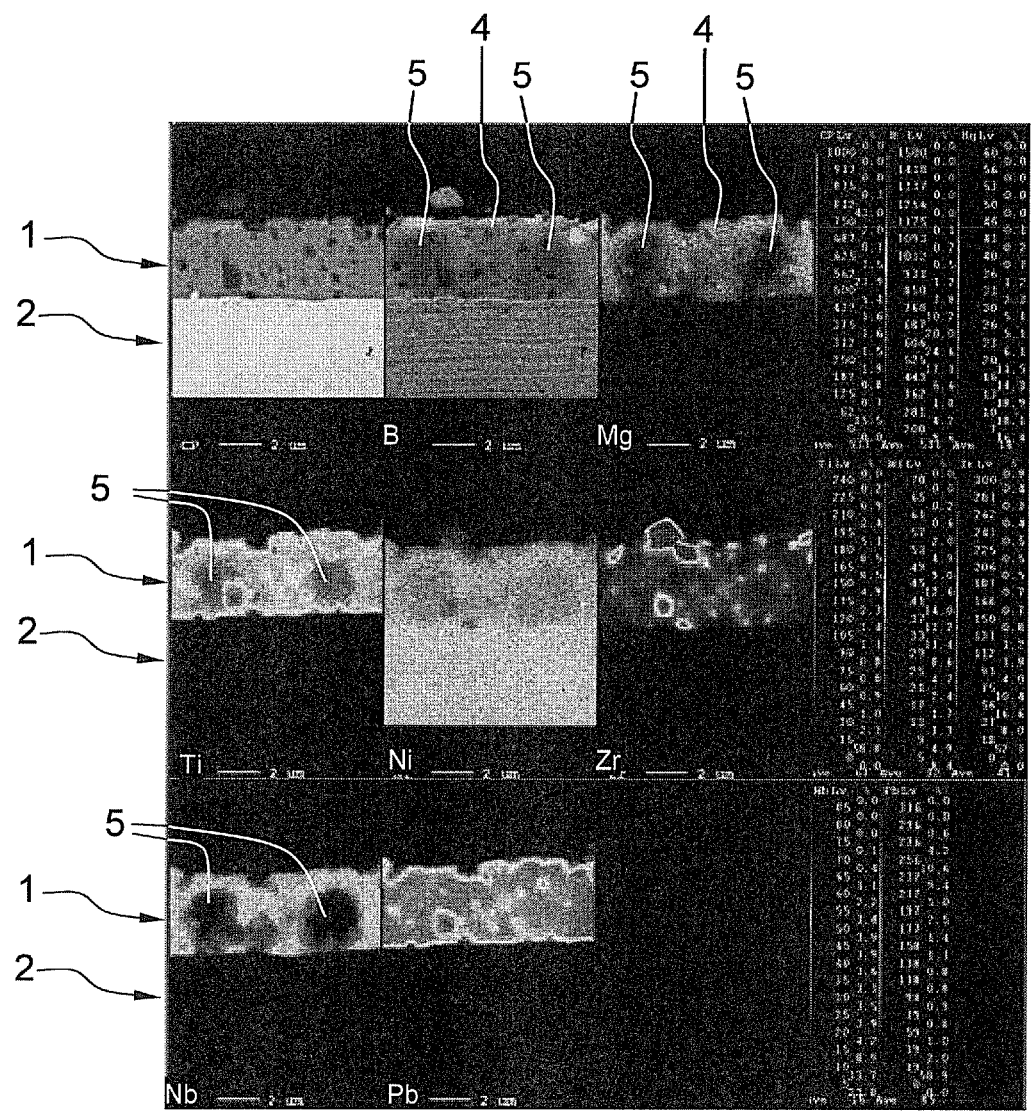
FIG. 6 is an image showing the results of EPMA according to a first example.

The ceramic sample was severed in a direction perpendicular to the planar direction and the distribution of the elements boron, magnesium, titanium, nickel, zirconium, niobium and lead was analyzed in the sectional surface using an electron probe micro-analyzer (EPMA). The results are shown in FIG. 6. The upper left column in FIG. 6 is a sectional image obtained from a scanning electron microscope (SEM).

4. Confirmation of the Presence of Lithium

The presence of lithium in the sintered body was confirmed by dissolving the ceramic sample in acid and applying inductively coupled plasma (ICP) emission spectrographic analysis.

5. Piezoelectric Characteristics

Figure 8:
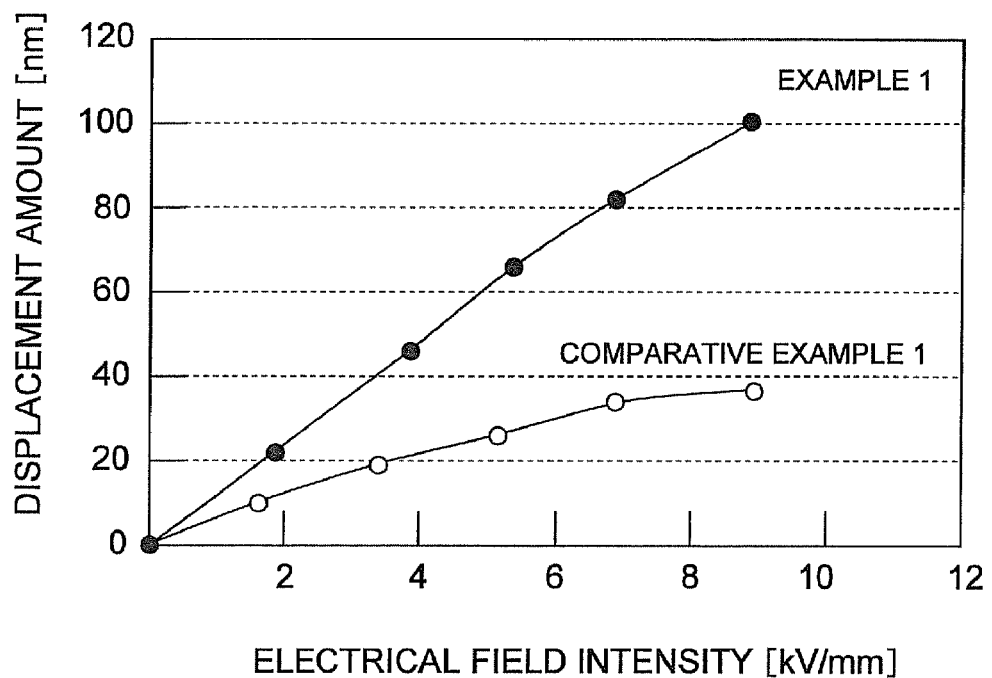
FIG. 8 is a graph showing piezoelectric characteristics in a first example and comparative example 1.

An upper electrode was formed on the ceramic by Au sputtering. The displacement amount of the ceramic when a voltage was applied from a DC power course between the upper electrode and the platinum base plate acting as the lower electrode was measured using a laser Doppler vibrometer. The results are shown in FIG. 8.

Comparative Example 1

A sintered body was obtained using the same operational method described in example 1 with the exception that an additive material was not used. In other words, 20PMNN-BNN-80PZT was obtained as a paste using the same procedure as the first example and was coated onto a Pt base plate having template grains arranged thereon using a spin-coating method. Thereafter, a sample was prepared after passing through degreasing and sintering.

[Results]
(Orientation)

In Example 1, an orientation of 98% was obtained. In contrast, in Comparative Example 1, almost no crystal orientation was observed and the orientation was 0%.

(EPMA)

The EPMA image in FIG. 6 actually shows the portion having a high atomic concentration of the detection object as red, and portions of low concentration as blue (even lower portions are black). In FIG. 6, the same reference numerals as those in FIG. 1 are assigned to portion corresponding to the portions in FIG. 1.

As shown in FIG. 6, the composition of the ceramic represented by the sintered body in Example 1 (atomic distribution) is non-uniform. This type of non-uniform distribution, that is to say non-uniformity, is thought to result from differences in the composition between the template grains and the matrix. For example, although boron is contained in the matrix, it is not contained in the template. Therefore the concentration is low in portions originating from the template grains. The same results were obtained in relation to magnesium and niobium. In portions having a low concentration of boron, there was a tendency for a high concentration of titanium.

(Distribution of Boron Concentration)

Figure 7A:
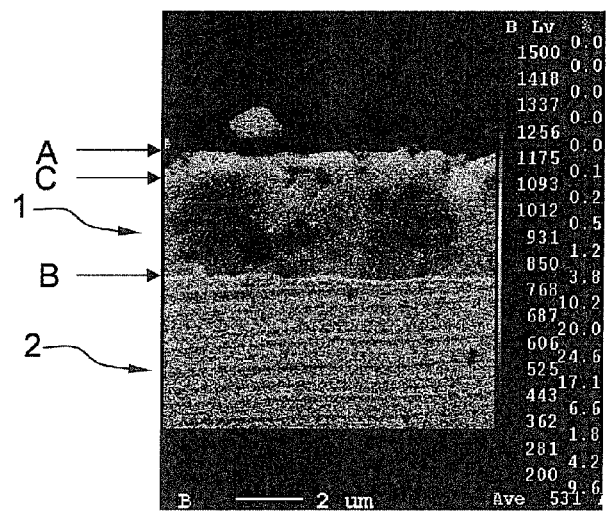
FIG. 7A is an image showing the results of EPMA in relation to boron according to a first example.
Figure 7B:
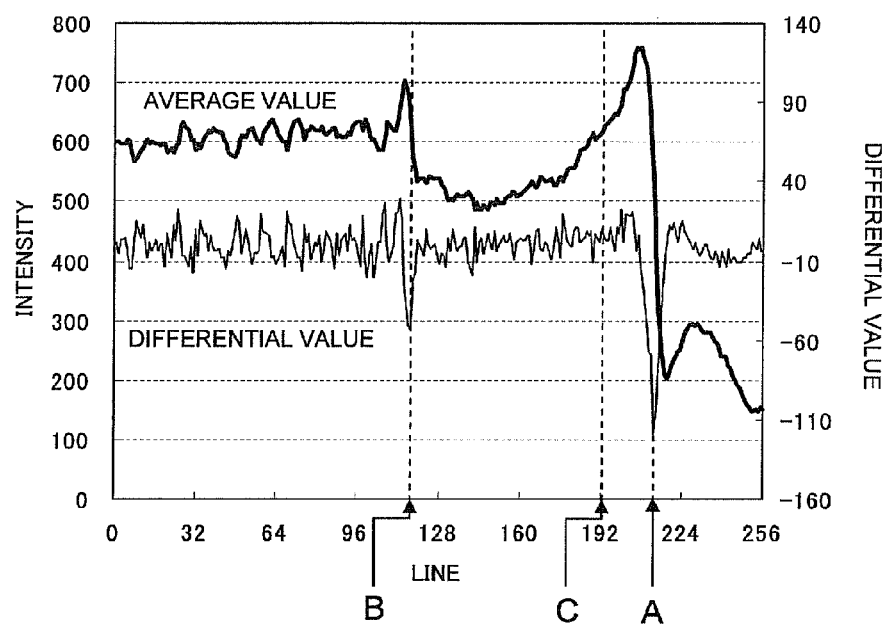
FIG. 7B is a graph showing the distribution of boron in a thickness direction.

In Example 1, signals of 256×256 dots were obtained by EPMA in relation to boron (FIG. 7A). From the lower surface of the base plate, in other words the lower side of FIG. 7A, the signal intensity of the dots on the each horizontal line was totaled. The average signal intensity per dot on each line was calculated by dividing the resulting total value by the number of dots per line (FIG. 7B). This average value was differentiated to prepare a differential curve (FIG. 7B). The range of the ceramic was specified with reference to the extreme values of the differential curve. As shown in FIG. 7B, the position A (line 213) is the upper end of the ceramic and the position B (line 117) is the lower end of the ceramic (the interface between the ceramic and the base plate). FIG. 7A shows the corresponding position.

The maximum value of the average signal intensity between the position A and the position B was 760, and the minimum value was 487. Since the average of these two values is 624, the threshold value was determined as 624. Lines displaying an average signal intensity equal to or less than this threshold are lines 117 to 193. Thus the upper end of the low boron concentration region is line 193 (position C) and the thickness of the low boron concentration region is the thickness from position B to position C (193−116=77 lines). The thickness of the ceramic portion is 213−116=97, and therefore (low boron concentration region thickness)/(overall ceramic thickness)=0.79, and therefore satisfies the above range.

(Presence of Lithium)

Lithium remained in the ceramic according to Example 1 after sintering.

(Piezoelectric Characteristics)

As shown in FIG. 8, the ceramic according to Example 1 displays a large displacement amount in the same electric field intensity in comparison with the ceramic in Comparative Example 1, and the displacement amount displays excellent linearity with respect to the field intensity.

In this manner, the ceramic according to Example 1 has preferred characteristics as a piezoelectric body.

What is claimed is:

1. A ceramic including a plurality of crystal grains that contain lithium and boron, are arranged in a planar direction, and have a mutually same crystal orientation with respect to the thickness direction, the ceramic comprising a portion defined by parallel sectional surfaces in a thickness direction, the portion being equally divided into a plurality of segments by parallel sectional surfaces in a planar direction, and when the amount of boron in each segment is compared, the thickness of a low boron concentration region, the low boron concentration region being a collection of segments displaying a boron amount of less than or equal to an average value for the maximum value and minimum value of the boron amount, is greater than or equal to 20% to less than or equal to 90% of the overall thickness of the portion.

2. The ceramic according to claim 1, wherein the low boron concentration region is biased toward one of either end in the thickness direction of the portion.

3. The ceramic according to claim 1, wherein in at least a portion of the ceramic, the number of crystal grains disposed with respect to the thickness direction is one.

4. The piezoelectric or electrostriction element comprising the ceramic according to claim 1 and a pair of electrodes electrically connected with the ceramic.

* * * * *